Sept. 12, 1961 KAM LI 2,999,987

CONVERTER CIRCUITS

Filed May 18, 1959 2 Sheets-Sheet 1

INVENTOR.
KAM LI

BY John V. Regan
ATTORNEY

Sept. 12, 1961 KAM LI 2,999,987

CONVERTER CIRCUITS

Filed May 18, 1959 2 Sheets-Sheet 2

INVENTOR
KAM LI

BY John V. Regan
ATTORNEY

United States Patent Office 2,999,987
Patented Sept. 12, 1961

2,999,987

CONVERTER CIRCUITS

Kam Li, Levittown, Pa., assignor to Radio Corporation of America, a corporation of Delaware Filed May 18, 1959, Ser. No. 813,881
12 Claims. (Cl. 332—1)

This invention relates to circuits for, and methods of converting an information signal represented in pulse form to an information signal represented in phase form.

In certain information handling systems, information is represented in pusle form. The two binary digits may be represented, for example, by the two polarities of a pulse signal, or by the presence and absence, respectively, of a pulse signal in a given time interval. A notation using such pulse signals may be referred to as amplitude script. In other information handling systems, the two binary digits are represented, respectively by two mutually opposite phases of a continuous signal. For example, in systems using phase locked oscillator circuits, a continuous signal in either one or the other of the two phases is used to represent the one and the other binary digits. This type of notation system may be referred to as phase script. Each of these scripts, amplitude and phase, has certain advantages. On the one hand, amplitude script is at present more readily used with coincident current core memories than is phase script. On the other hand, logic circuits using phase script are relatively simple and reliable since the phase of the logical signal is readily locked to the phase of a control signal without involving critical timing problems. Also, the phase script logical circuits operate by simple majority control. It is often desired to convert from one of these types of script to the other.

It is an object of the present invention to provide a converter circuit for converting an amplitude script signal to a phase script signal.

Another object of the present invention is to provide improved converter circuits, of relatively simple construction for matching a pulse signal source to a phase locked oscillator circuit.

Another object of the present invention is to provide improved converter circuits which can provide a direct coupling between an amplitude script information signal and a phase script output signal without requiring auxiliary circuits for performing the conversion.

According to the present invention, a converter circuit includes a phase locked oscillator circuit having an input for receiving the amplitude script input signal. The circuit is arranged so that the oscillator output signal builds up in either one of the two phases under the control of the input signal.

Figure 1:
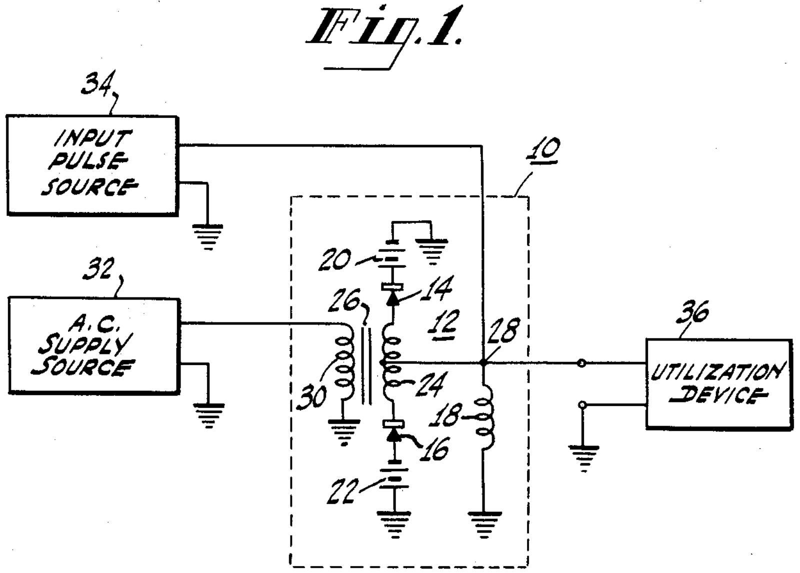
FIG. 1 is a schematic diagram of one embodiment of a converter circuit according to the invention.

The converter circuit 10 of FIG. 1 includes a parametric oscillator circuit 12 arranged in a balanced circuit 12. The oscillator circuit includes, for example, a pair of variable capacity diodes 14 and 16 and a linear inductance element 18. The diodes 14 and 16 are each biased in the reverse direction by a pair of batteries 20 and 22, respectively. A.C. supply signals are applied to the diodes 14 and 16 via a secondary winding 24 of a linear supply transformer 26. The secondary winding 24 has a center-tap connected to a junction point 28. The linear inductance 18 is connected between the junction point 28 and a point of reference potential, indicated in the drawings by the conventional ground symbol. The primary winding 30 of the supply transformer 26 is connected to the output of an A.C. supply source 32. An input pulse source 34 has an output connected to the junction point 28. A utilization device 36 has an input connected to the junction point 28. The supply source 32, the pulse source 34, and the utilization device 36 each is provided with a ground connection. Each of the batteries 20 and 26 also has a ground connection. Other arrangements of parametric oscillator circuits may be used, if desired. Copending application Serial No. 767,673, filed by L. S. Onyshkevych and W. F. Kosonocky on October 16, 1958 described details of a parametric oscillator circuit such as the circuit 12, as well as other forms of variable capacity parametric oscillator circuits. An article by E. I. Goto entitled "Parametric Excitation and its Application to a Nonlinear Pendulum," published in the "Journal of the Institute of Electrical Communication Engineers of Japan," vol. 38, 1955 describes a parametric oscillator circuit using a pair of nonlinear magnetic elements and a linear capacitor arranged in a parametric oscillator circuit.

In operation, the A.C. supply source 32 applies a supply signal of frequency $2f$ to the supply winding 30 of the oscillator circuit 12. The oscillator circuit 12 starts to oscillate at a harmonic frequency of the supply frequency, for example, the second subharmonic frequency $f$, and in either one or the other of two phases. The two phases conveniently may be called phase A and phase B. The phase A signal is 180° out of phase with the phase B signal. The build-up of the oscillations occurs within a finite time interval from, say, one to ten cycles of the subharmonic frequency. In the absence of any input signal, the phase of the oscillator signals is determined by a momentary circuit unbalance, or a momentary noise signal. In the absence of a control signal, there is an equal probability that the build-up will be either in the phase A or the phase B, since the unbalance and noise signals occur in random fashion. In the prior art, the output phase is controlled by applying a phase script control signal of the desired phase A or B and of the subharmonic frequency $f$ to the oscillator 12. The control signal is applied just prior to the application of the supply signals. The control signal is of sufficient amplitude to override any transient noise signals. After the oscillator signals have reached a given amplitude, the control signals can be removed, and, thereafter, the oscillator continues to operate in the phase determined by the prior control signal.

Figure 2:
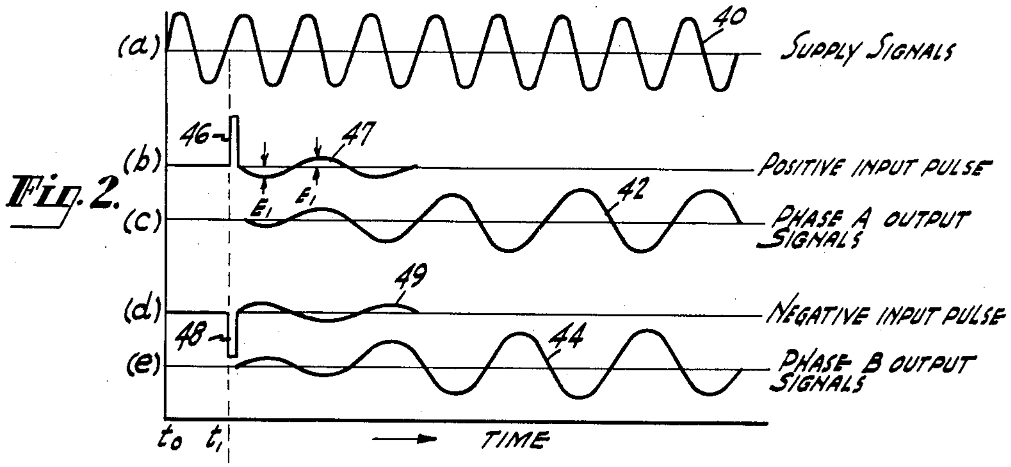
FIG. 2 is a schematic diagram of waveforms, all in the same time scale, illustrating the operation of the converter circuit of FIG. 1 in response to opposite polarity input pulses.

According to the present invention, the phase of the oscillator 12 output signals are controlled by a momentary input pulse from the input pulse source 34. The input pulse is applied selectively of either one or the other polarity. The waveforms of FIG. 2 illustrate the operation of the circuit of FIG. 1 in response to opposite polarity, amplitude script signals. At time $t_0$ the supply signal waveform of line $a$ is started. The two possible output signals are represented by the waveforms 42 and 44 of lines $c$ and $e$, respectively. Assume that at a time $t1$, when the supply waveform 40 completes its first cycle, that the input pulse source 34 is operated to apply a positive polarity input pulse 46 of line $b$ to the oscillator circuit. Note that the output waveforms 42 and 44 have not built up to any appreciable degree at the time *t1*. Preferably, the duration of the positive input pulse 46 is made small, that is, about 10%, compared to the period of one-half cycle of the supply waveform 40. The input pulse 46 injects a net energy of a given sign into the oscillator circuit. This injected energy, even though of relatively short duration, unbalances the oscillator circuit in the direction of the phase A output waveform. The supply signals 40 then continue the unbalancing in the phase A and the oscillations build-up to their maximum amplitude in the phase A. Also, due to the storage properties of the oscillator circuit, energy injected by the input pulse 46 decays over a given time interval and at a frequency closely related to the subharmonic oscillator frequency as indicated by the exponential waveform 47 of line *b*. The oscillator is initially tuned to have a natural frequency close to or at the subharmonic frequency *f*. This exponential decay waveform 47, therefore, is sufficiently close to subharmonic frequency *f*, so that the phase of the build-up of the oscillator signal is further controlled by the decay waveform 47. The pulse 46 amplitude need only be sufficiently large such that the amplitude E1 of the decay waveform 47 is greater than any random noise signals present in the oscillator circuit.

A negative polarity input pulse 48 causes the oscillator output signals to build-up in the opposite phase B as indicated at lines *d* and *e* of FIG. 2. The negative input pulse 48 of line *d* also produces a similar exponential decay waveform 49 of opposite phase from the decay waveform 47 of line *b*. Thus, the phase of the oscillator output signal applied to the utilization device 36 of FIG. 1 has a one-to-one correspondence between the polarity of the input pulse signal from the input pulse source 34.

Figure 3:
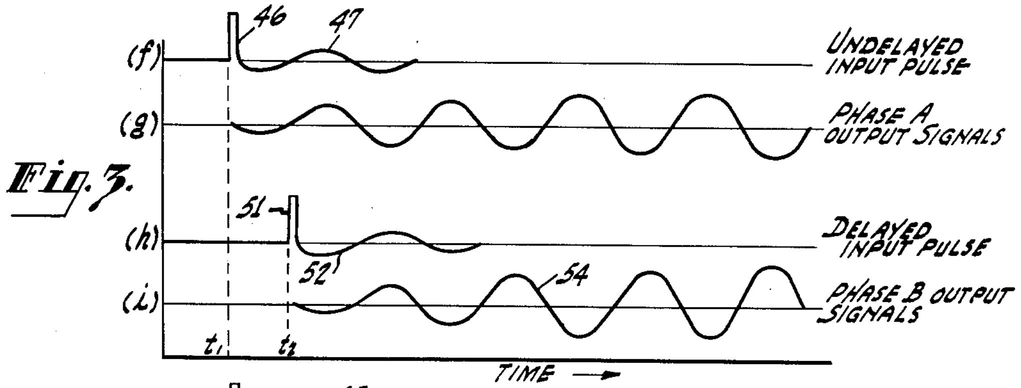
FIG. 3 is a schematic diagram of wave forms, all in the same time scale, illustrating the operation of the circuit of FIG. 2 in response to input pulses of delayed type.

The input pulse source 34 also may be arranged to provide selectively a signal which occurs either during the time *t1*, or during a time *t2* delayed from the time *t1* by one-half cycle of the subharmonic frequency. The delayed and undelayed signals are each of the same polarity, for example, positive. A positive polarity input pulse occurring at the time *t1* causes the oscillator output to build-up in the phase A as indicated in lines *f* and *g* of FIG. 3. The waveforms of lines *f* and *g* correspond to the waveforms of lines *b* and *c* of FIG. 2, and the same reference numerals are used when designating the corresponding waveforms. The delayed positive input pulse 51 is indicated at line *h* of FIG. 3. The positive input pulse 51 again injects energy into the oscillator circuit in the manner described above for the positive pulse 46. Because of the 180° delay, the positive injected pulse 51 now unbalances the oscillator circuit in the phase B direction. The supply signals again cause the oscillator to "lock" on the phase B output signals. The delayed and undelayed input pulses need not be exactly 180° displaced but may be displaced a varying number of degrees so long as the undelayed pulse 46 causes the output waveform to occur in the desired phase B. After the pulse 51 is terminated, the injected energy again decays to zero value along an exponential waveform 52. The decay waveform 52 for the delayed pulse 51 is similar to the decay waveform 47 for the undelayed pulse 46 but is 180° out of phase therewith. The oscillator build-up is locked to that of the phase B output waveform, as indicated by the waveform 54 of line *i*. The utilization device 36 receives either a phase A or a phase B output signal in accordance with whether an undelayed pulse 46 or a delayed pulse 51 was applied to the converter circuit by the input pulse source 34.

Figure 4:
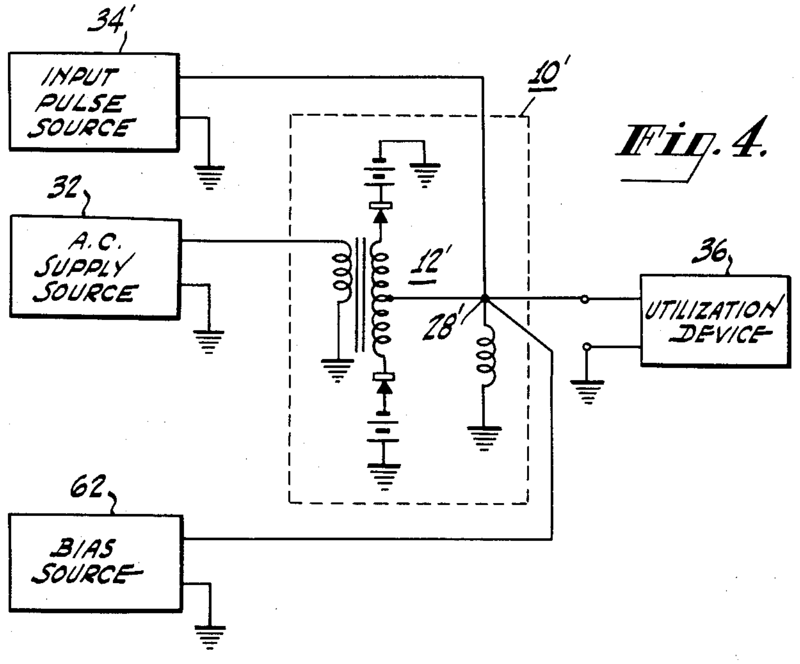
FIG. 4 is a schematic diagram of another embodiment of a converter circuit according to the present invention using an additional bias input.

The converter circuit 10 may be modified to operate with an input pulse source which applies selectively to the oscillator either an input pulse or no input pulse to represent the two binary digits. The embodiment of the converter circuit 10' of FIG. 4 is similar to the converter circuit 10 of FIG. 1 except that a bias signal of one phase, say the phase B, is coupled to the oscillator circuit 10'. The phase B bias signal is provided, for example, by a bias source 62 having one output connected at the junction point 28' and another output connected to the common ground. The bias source 62 provides the phase B signals at the subharmonic frequency *f*. In the absence of an input pulse of at least a minimum amplitude, the phase B bias signal insures that the utilization device 36 receives phase B input signals. The input signals to the utilization device 36 are of larger amplitude than that of the bias signal. The phase B input signal to the utilization device 36 represents in the circuit of FIG. 4, either the total absence of an input pulse, or an input pulse of amplitude less than that required to overcome the phase B bias signal.

Figure 5:
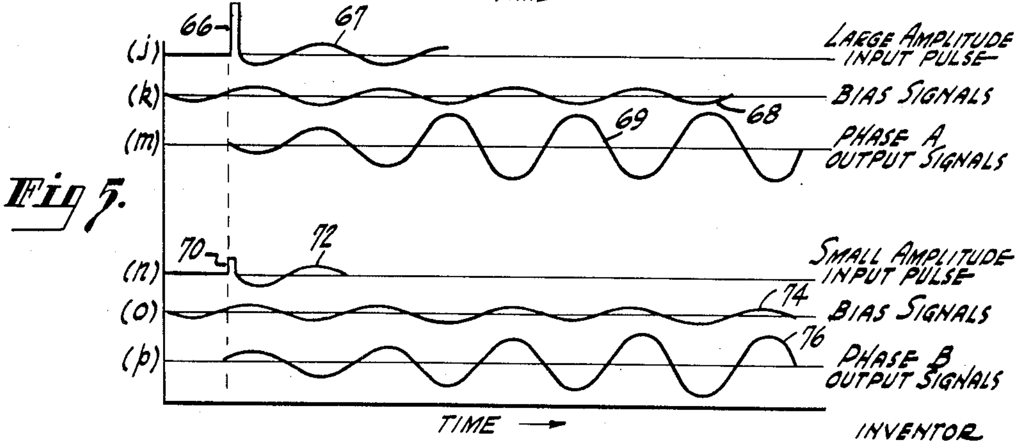
FIG. 5 is a diagram of waveforms, all in the same time scale, illustrating the operation of the system of FIG. 4 in response to the presence and absence of input pulses in a given time interval.

In operation, a positive input pulse 66, indicated at line *j* of FIG. 5, and applied by the input pulse source 34' at the time *t1* unbalances the oscillator in the phase A direction. The positive pulse 66 also produces a decay waveform 67 in the phase A direction. The amplitude of the positive pulse 66 is made sufficiently large to overcome the phase B bias signal, indicated by the waveform 68 of line *k*, plus any random noise signals in the phase B direction. The oscillator then locks to and builds up in the desired phas A, as indicated by the waveform 69 of line *m*.

In the absence of the large amplitude input pulse 66, the build-up of the oscillator signals is in the phase B as determined by the bias control signal. Assume now, that a relatively small amplitude input, such as the positive pulse 70 of line *n* is applied by the input pulse source 34' to the oscillator circuit 10' at the time *t1*. The small amplitude pulse 70 injects relatively little energy into the oscillator circuit, as indicated by the small amplitude decay waveform 72. The input signal 70 is of insufficient amplitude to overcome the bias signal, indicated by the waveform 74 of line *o*. Therefore, the oscillator builds-up in the phase B, as indicated by the waveform 76 of line *p*. The utilization device 36 then receives either a phase A or a phase B signal in a one-to-one correspondence with the presence or absence of an input pulse of a given amplitude from the input pulse source 34' (FIG. 2).

In each of the described modes of operation of the converter circuit of the invention, it is assumed, for convenience of explanation, that the actual build-up of the oscillator output signals did not begin until one cycle of the supply waveform 40 had occurred. However, the input pulse signals can be applied at a time after the actual build-up of the oscillator signals has started by increasing the amplitudes of the input pulses. The increase in amplitude is required so that the net energy supplied to the oscillator by the input pulse is sufficient to change the oscillations to the desired phase. Thus, an input pulse may be applied any time just prior to, or during, the build-up interval of the oscillator output signals. The number of cycles, at the subharmonic frequency, of the build-up interval is determined by the circuit parameters, by the amplitude of the supply signal, the amplitude of the input pulses, and so on. In practice, the build-up may occur over a time interval ranging from one to ten cycles of the subharmonic frequency.

If desired, or necessary, synchronizing signals from any suitable known synchronizing source can be applied to the input pulse source 34 and the A.C. supply source 32 to control the times of application of the input pulses and supply signals to the converter circuit 10. Such synchronizing means are relatively well-known in the art and need not be described in detail.

There have been described herein improved circuits for converting amplitude script devices to phase script devices. Three separate modes of operation of these circuits have been descrbed. In a first mode, the circuit provides an output signal having a phase determined by the polarity of the input pulse signal. In a second mode, the phase of the output signal is determined by the position in time of an input pulse signal; and in the third mode, the phase of the output signal is determined by the presence and absence of an input pulse.

What is claimed is:

1. A circuit for converting a unidirectional pulse signal to a phase signal comprising a parametric oscillator having an input for receiving said pulse signal and an output for providing said phase signal, means for applying supply signals to said oscillator, said oscillator, upon application of said supply signals, oscillating in either one or the other of two phases, said oscillations building up to a maximum value in a given time interval, and means for applying selectively said pulse signal during said given time interval to control the phase of said oscillations.

2. A circuit for converting information signals represented in amplitude form to information signals represented in phase form comprising a parametric oscillator having an input, for receiving said amplitude signals, a supply input, and an output for providing said phase signals, the oscillations being in either one or the other of two distinct phases at a frequency different from the frequency of signals applied to said supply input, said oscillations, upon application of said supply signals, building up to a maximum amplitude in a given time interval, and means for controlling the phase of said oscillations comprising means for applying selectively a momentary input pulse to said signal input during said given interval.

3. A circuit as recited in claim 1, the one and the other of said oscillation phases being determined by the polarity of said pulse signal.

4. A circuit as recited in claim 1, said circuit operating in one of said phases in response to a first pulse signal applied during a first time interval, and said circuit operating in the other of said phases in response to a second pulse signal during a second time interval delayed from said first time interval.

5. A circuit as recited in claim 1, the one and the other of said two oscillation phases being determined respectively by pulse signals above and below a given amplitude, and means for applying a bias signal of one phase to said oscillator circuit, said bias signals being of sufficient amplitude to override a pulse signal of amplitude less than said given amplitude.

6. In a parametric oscillator circuit arranged to oscillate at a given frequency in either one or the other of two phases, said given frequency being harmonically related to supply signals coupled to said oscillator circuit, and said oscillations requiring a finite number of cycles at said given frequency to build-up to a maximum value, the method of controlling the phase of the build-up of said oscillation signals comprising the step of applying a momentary pulse signal to said oscillator during said build-up interval, whereby the phase of said oscillations is determined by said input pulse.

7. In a method of controlling the phase of an oscillator circuit, the method as recited in claim 6, said applied input pulse being of either one or the other polarity to establish the oscillator respectively in either one or the other of said two phases.

8. In a method of operating a parametric oscillator circuit, the method as recited in claim 6, including means for coupling a bias signal of one phase at said given frequency to said oscillator circuit, said bias signal controlling the phase of said oscillations in the absence of an input signal.

9. In the method of operating a parametric oscillator circuit, the method as recited in claim 6, said input pulse being of one polarity, and said one oscillation phase being determined when said input pulse is applied during a first time interval and said opposite oscillation phase being determined when said input pulse is applied during a second time interval delayed from said first time interval.

10. A circuit for converting a unidirectional pulse signal to a phase signal comprising a parametric oscillator having an input for receiving said pulse signal and an output for providing said phase signal, means for applying supply signals to said oscillator, said oscillator, upon application of said supply signal, oscillating in either one or the other of two phases, said oscillations building up to a maximum value in a given time interval, and means for applying selectively said pulse signal to control the phase of said oscillations.

11. A circuit as recited in claim 10, said input pulse being applied at a time just prior to the start of said given time interval.

12. A circuit as recited in claim 10, said pulse signal being applied at the start of said given time interval.

References Cited in the file of this patent

UNITED STATES PATENTS 2,815,488 Von Neumann ............ Dec. 3, 1957